(12) United States Patent
Silkiss-Hero et al.

(10) Patent No.: US 12,672,250 B2
(45) Date of Patent: Jun. 30, 2026

(54) FLEXIBLE CIRCUIT ASSEMBLY AND COVER FOR TRACTION INVERTER SYSTEM FOR AN ELECTRIC VEHICLE

(71) Applicant: Rivian IP Holdings, LLC, Irvine, CA (US)

(72) Inventors: Che Daniel Silkiss-Hero, Long Beach, CA (US); Juan Lopez, Wildomar, CA (US); Navin Pillai, Carson, CA (US); Young Doo, La Palma, CA (US)

(73) Assignee: Rivian IP Holdings, LLC, Irvine, CA (US)

( * ) Notice: Subject to any disclaimer, the term of this patent is extended or adjusted under 35 U.S.C. 154(b) by 228 days.

(21) Appl. No.: 18/674,467

(22) Filed: May 24, 2024

(65) Prior Publication Data

US 2025/0365880 A1 Nov. 27, 2025

(51) Int. Cl.
*H05K 7/14* (2006.01)
*H05K 1/02* (2006.01)

(52) U.S. Cl.
CPC ......... *H05K 7/1432* (2013.01); *H05K 1/0216* (2013.01); *H05K 1/028* (2013.01); *H05K 2201/0715* (2013.01)

(58) Field of Classification Search
CPC .... H05K 7/1432; H05K 1/0216; H05K 1/028; H05K 2201/0715
USPC ......................................................... 361/749
See application file for complete search history.

(56) References Cited

U.S. PATENT DOCUMENTS

2013/0045611 A1* 2/2013 Macdougall ........... H01R 12/73
439/55
2022/0354014 A1* 11/2022 Feurtado ............... H02M 7/537

* cited by examiner

*Primary Examiner* — Andargie M Aychillhum
(74) *Attorney, Agent, or Firm* — Patterson + Sheridan, LLP

(57) ABSTRACT

A flexible circuit assembly and a cover for a traction inverter system of an electric vehicle are provided. The flexible circuit assembly includes a flexible printed circuit body, a first connector, and a second connector. The flexible printed circuit body forms an angled shape having an inner side and an outer side. The cover includes an outer surface, an inner surface including ribs, and a perimeter configured to be attached to a housing. The outer surface includes a central region, a first lateral region, and a second lateral region, and a constrained layer damping material. The central region, the first lateral region, and the second lateral region form contours, and the constrained layer damping material conforms to the contours.

18 Claims, 12 Drawing Sheets

FLEXIBLE CIRCUIT ASSEMBLY AND COVER FOR TRACTION INVERTER SYSTEM FOR AN ELECTRIC VEHICLE

INTRODUCTION

The present disclosure relates to electric vehicles (EVs). More particularly, the present disclosure relates to a traction inverter system for an electric vehicle.

SUMMARY

Embodiments of the present disclosure advantageously provide a flexible circuit assembly and a cover for a traction inverter system for an electric vehicle.

In certain embodiments, the flexible circuit assembly includes a flexible printed circuit body, a first connector, and a second connector. The flexible printed circuit body forms an angled shape having an inner side and an outer side, and includes a stiffener region, a copper clad laminate (CCL) region disposed between a first cover region and a second cover region, and a shield region including a shield layer. The CCL region includes one or more trace layers. The first connector is attached to the stiffener region of a first end of the flexible printed circuit body. The second connector is attached to the stiffener region of a second end of the flexible printed circuit body.

In certain embodiments, the cover includes an outer surface, an inner surface including ribs, and a perimeter configured to be attached to a housing. The outer surface includes a central region, a first lateral region, and a second lateral region, and constrained layer damping material. The constrained layer damping material is attached to at least a portion of the central region, at least a portion of the first lateral region, and at least a portion of the second lateral region. The central region, the first lateral region, and the second lateral region form contours, and the constrained layer damping material conforms to the contours.

DETAILED DESCRIPTION

Figure 1:
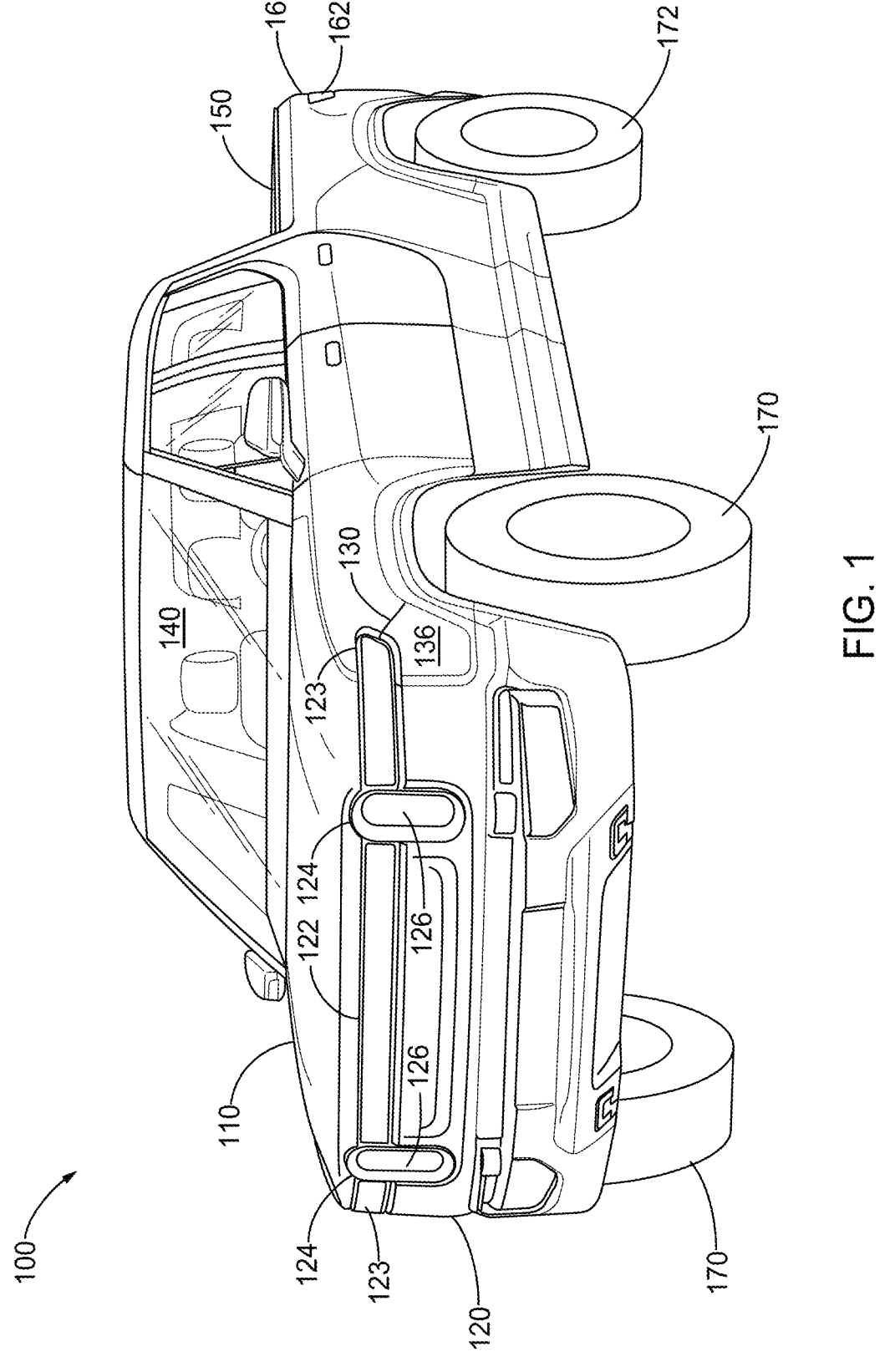
FIG. 1 depicts a diagram of an example electric vehicle, in accordance with embodiments of the present disclosure.

Generally, a single motor electric drive unit (EDU) for an electric vehicle includes, inter alia, an AC electric motor, a gearbox, and a traction inverter system. The gearbox couples the AC motor to a differential drive shaft for the front or rear wheels. The traction inverter system converts the DC power received from the battery to AC power to drive the AC electric motor. During regeneration, the traction inverter system converts the AC power generated by the AC motor into DC power to recharge the battery.

Similarly, a dual motor EDU for an electric vehicle includes, inter alia, two AC electric motors, two gearboxes, and a traction inverter system for each AC electric motor. Each gearbox couples one AC electric motor to a dedicated drive shaft for one wheel. The traction inverter systems convert the DC power received from the battery to AC power to drive each AC electric motor. During regeneration, the traction inverter systems convert the AC power generated by the AC motors into DC power to recharge the battery.

The traction inverter system includes a main controller board and a motor controller board for the power inverter modules (PIMs) for the AC motor. The main controller board is coupled to the motor controller board using a low voltage (LV) wire harness with individual copper wires.

Integrating the power electronics for two AC electric motors into a dual traction inverter system not only provides many advantages but may also present certain challenges, such as volumetric and weight constraints, electrical noise issues caused by the PIMs and the AC electric motors (such as electromagnetic interference or EMI), mechanical vibration issues caused by the AC electric motors and gearboxes, etc.

For example, reducing the volume of the dual traction inverter system may affect power and signal cable configurations, diameters, sizes, runs, etc., within the dual power electronics enclosure. Similarly, reducing the weight of the dual traction inverter system, such as by using a thinner cast or stamped cover, etc., may increase the airborne and structureborne noise radiated by the cover and propagated to the passenger compartment.

Embodiments of the present disclosure advantageously provide a flexible circuit assembly and a cover for a traction inverter system for a dual motor EDU for an electric vehicle.

A flexible circuit assembly couples the main controller board to each motor controller board. The flexible circuit assemblies provide a thinner footprint than an LV wire harness with individual copper wires, which improves the mechanical packaging of the connections between the main controller board and the motor controller boards. The flexible circuit assemblies also provide an integrated shielding layer to protect the main controller board and the motor controller boards from EMI. The flexible circuit assemblies have the same geometry and construction, and may be installed with any relative orientation. Using the same components advantageously simplifies parts tracking, simplifies assembly, reduces manufacturing time, etc.

The cover of the traction inverter system includes an assembly of constrained layer damping (CLD) material that significantly reduces the airborne and structureborne noise radiated by the cover and propagated to the passenger cabin (for example, by a factor of 10).

While aspects of the present disclosure are discussed with respect to a traction inverter system for a dual motor EDU (also known as a dual traction inverter system), the principles and advantages apply to a single traction inverter system as well, such as increased protection from EMI, reduced airborne and structureborne noise radiation, etc.

FIG. 1 depicts a diagram of an electric vehicle 100, in accordance with embodiments of the present disclosure.

Electric vehicle 100 includes, inter alia, a frame and body 110, an electrical power storage and distribution system, a propulsion system, a suspension system, a steering system, auxiliary and accessory systems (such as thermal management, lighting, wireless communications, navigation, etc.), etc.

Generally, body 110 may be directly or indirectly mounted to a frame (i.e., body-on-frame construction), or body 110 may be formed integrally with a frame (i.e., unibody construction). Body 110 includes, inter alia, front end 120, front light bar 122, front turn lights 123, stadium light ring 124, headlights 126, charging port 130 with charging port cover 136 concealing charging connector socket, driver/passenger compartment or cabin 140, bed 150, rear end 160 with rear tail lights 162, a rear light bar, etc. Electric vehicle 100 may be a pickup truck, a sport utility vehicle (SUV) in which bed 150 is replaced by an extension of cabin 140, or a sedan in which bed 150 is replaced by a trunk. In certain embodiments, electric vehicle may be an electric delivery vehicle, an electric cargo van, etc.

The propulsion system may include, inter alia, one or more electronic control units (ECUs), one or more electric drive unit (EDUs), front wheels 170, rear wheels 172, etc. The electrical power storage and distribution system may include, inter alia, one or more ECUs, a battery enclosure containing a battery pack including one or more batteries or battery modules (hereinafter "the battery"), a vehicle charging subsystem including charging port 130, high voltage (HV) cables connecting the battery to the EDUs, etc.

A single motor EDU may be used to drive front wheels 170 (front wheel drive) or rear wheels 172 (rear wheel drive). Additionally, a single motor EDU may be used to drive front wheels 170 and a single motor EDU may be used to drive rear wheels 172 (four wheel drive). A dual motor EDU may be used to independently drive front wheels 170 (independent front wheel drive) or rear wheels 172 (independent rear wheel drive). Additionally a dual motor EDU may be used to independently drive both front wheels 170 and a dual motor EDU may be used to independently drive both rear wheels 172 (independent four wheel drive).

FIGS. 2A, 2B, 2C, 2D present top, bottom, front, and rear views of traction inverter system (TIS) 200 (respectively), in accordance with embodiments of the present disclosure.

In certain embodiments, a dual motor EDU for an electric vehicle may include, inter alia, two 3-phase AC electric motors, two gearboxes, and TIS 200 that contains power electronics. TIS 200 may include a capacitor module (such as a DC link capacitor, etc.), six PIMs, a cooling subsystem, a main controller board and two motor controller boards each including one or more controllers, processors, supporting components, circuitry, connectors, etc. Three PIMs are provided for each motor, and one PIM generates one phase of the AC power provided to each 3-phase AC motor. Additionally, an HV battery cable connector, electrical signal connectors, and cooling subsystem connectors are also provided.

Figures 2A, 2B:
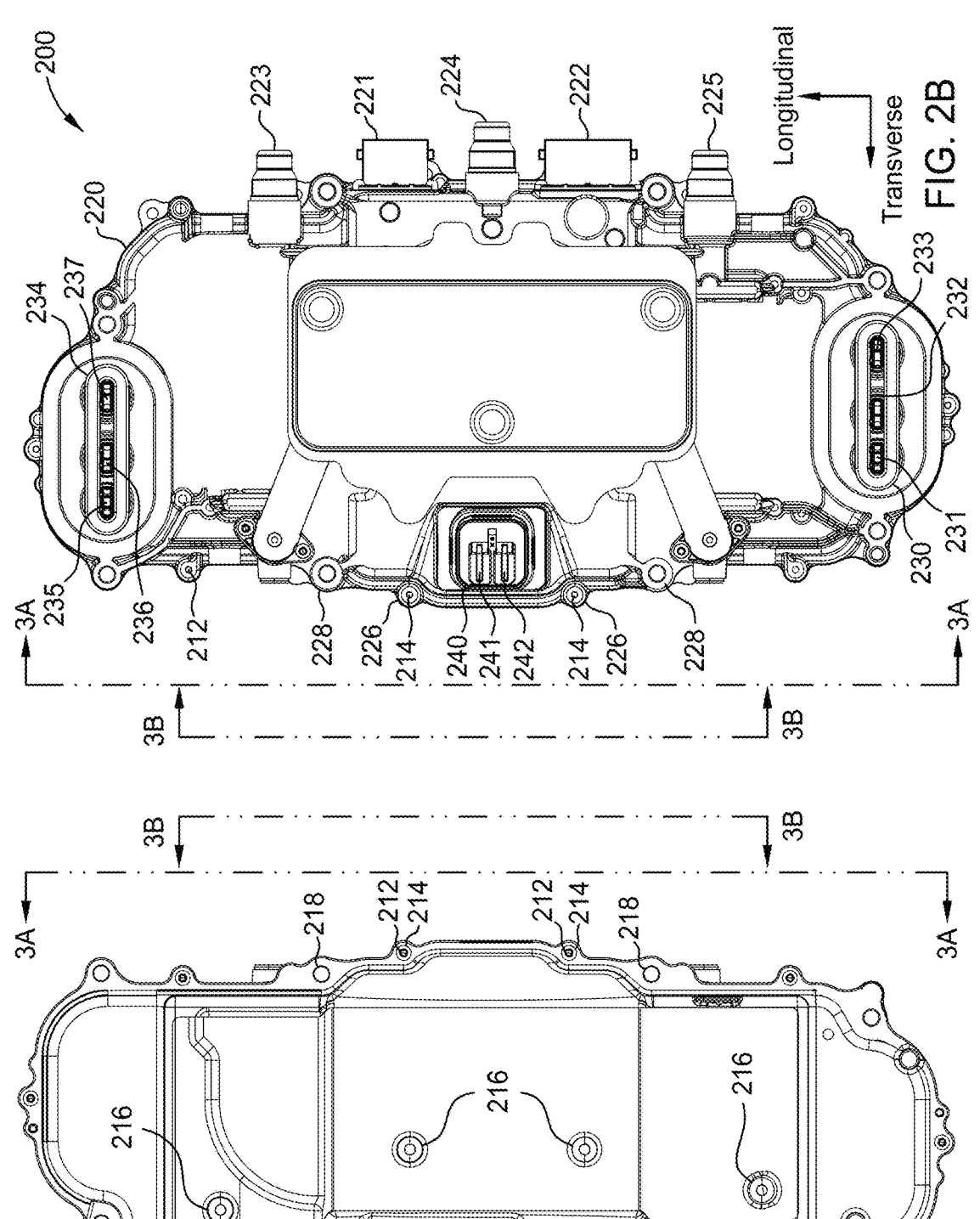
FIGS. 2A, 2B, 2C, 2D present top, bottom, front, and rear views of an example traction inverter system (respectively), in accordance with embodiments of the present disclosure.

FIGS. 2A and 2B present top and bottom views of TIS 200, in accordance with embodiments of the present disclosure.

Power electronics module 200 includes cover 210 and housing 220, which form a sealed enclosure for the power electronics mounted within.

Cover 210 may be a metal casting, stamping, etc., that is formed as a single component. Cover 210 may conform closely to the dimensions of the power electronics contained within TIS 200. In other words, cover 210 may be contoured to minimize the volume within TIS 200.

Cover 210 may define a number of openings 212 to receive fasteners 214 that cooperate with threaded holes 226 in housing 220 to secure cover 210 to housing 220. Two openings 212 and two fasteners 214 are identified in FIGS. 2A, 2B. Cover 210 may define a number of bosses 216 for attaching certain components to TIS 200 (four bosses 216 are identified in FIGS. 2A, 2C, 2D), such as a mount for a wiring harness, etc. Each boss 216 may define an opening that is configured to receive a mount fastener, such as a snap fit connector, etc. Cover 210 may also define a number of openings 218 to receive fasteners (not shown) that pass through bosses 228 in housing 220 to secure TIS 200 to the drive unit, and more particularly, to the housings of the motors and the gearbox. Two openings 218 and two bosses 228 are identified in FIGS. 2A, 2B.

Housing 220 may be a metal casting that is formed as a single component.

Housing 220 includes a number of external connectors, such as electrical signal connector 221, electrical signal connector 222, cooling subsystem connectors 223, 224, 225, electric motor 1 busbar assembly 230, electric motor 2 busbar assembly 234, and HV battery cable connector 240. Generally, electrical signal connectors 221, 222 are pin-type connectors. Electric motor 1 busbar assembly 230 includes A terminal blade 231, B terminal blade 232, and C terminal blade 233. Similarly, electric motor 2 busbar assembly 234 includes A terminal blade 235, B terminal blade 236, and C terminal blade 237. HV battery cable connector 240 includes positive terminal blade 241 and negative terminal blade 242.

Electric motor 1 busbar assembly 230 is connected to 3-phase AC electric motor 1, electric motor 2 busbar assembly 234 is connected to 3-phase AC electric motor 2, and HV battery cable connector 240 is connected to the battery via an HV battery cable.

Longitudinal and transverse axes for TIS 200, as well as section lines 3A, 3B are identified FIGS. 2A, 2B.

Figures 2C, 2D:
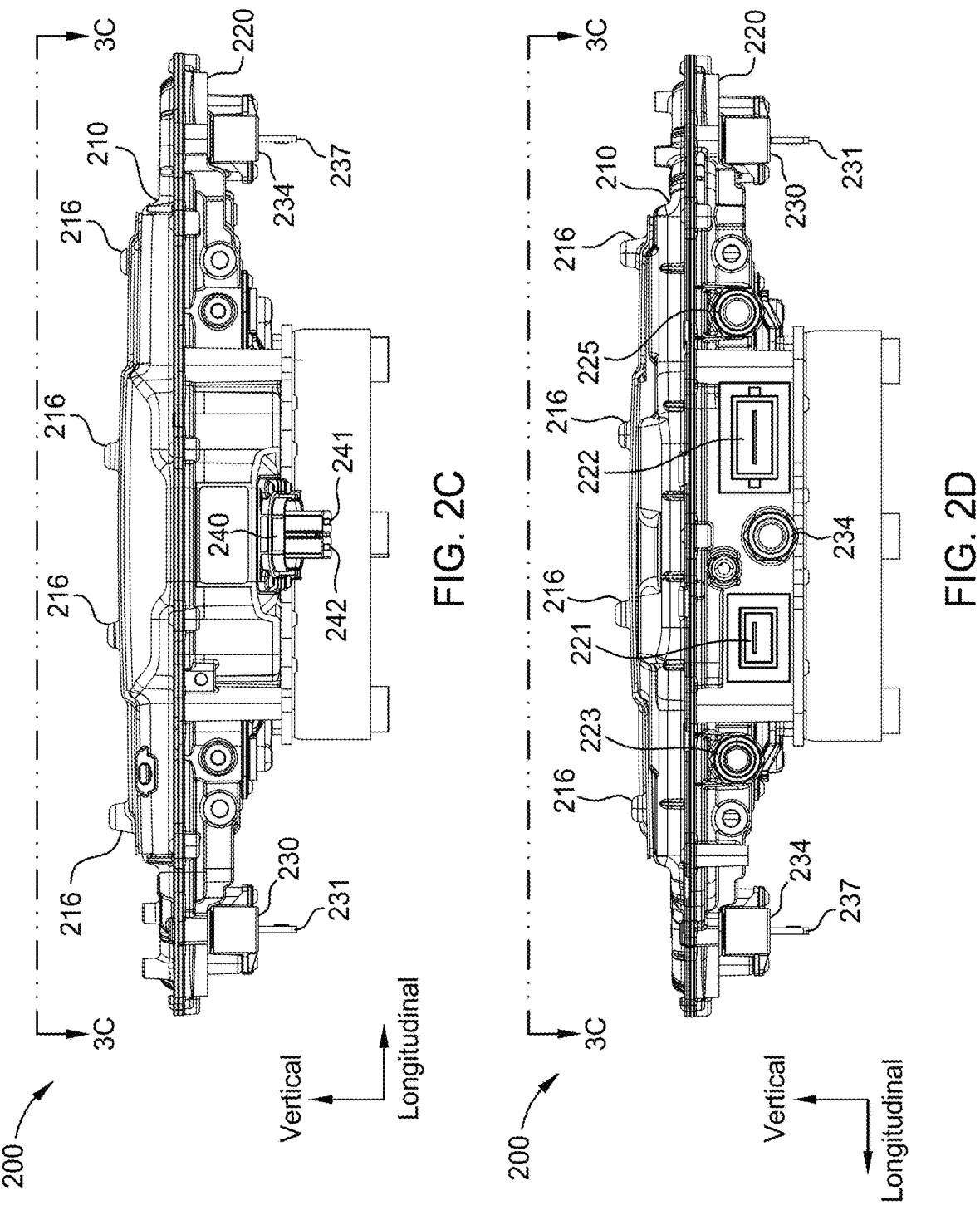

FIGS. 2C and 2D present front and rear views of TIS 200, in accordance with embodiments of the present disclosure.

Cover 210, housing 220, electric motor 1 busbar assembly 230 with A terminal blade 231, electric motor 2 busbar assembly 234 with A terminal blade 235, and HV battery cable connector 240 with positive terminal blade 241 and negative terminal blade 242 are identified in FIG. 2C.

Cover 210, housing 220, electrical signal connector 221, electrical signal connector 222, cooling subsystem connectors 223, 224, 225, electric motor 1 busbar assembly 230 with C terminal blade 233, electric motor 2 busbar assembly 234 with C terminal blade 237, and HV battery cable connector 240 with positive terminal blade 241 and negative terminal blade 242 are identified in FIG. 2D.

Longitudinal and vertical axes for TIS 200, as well as section line 3C, are also identified FIGS. 2C, 2D.

Figure 3A:
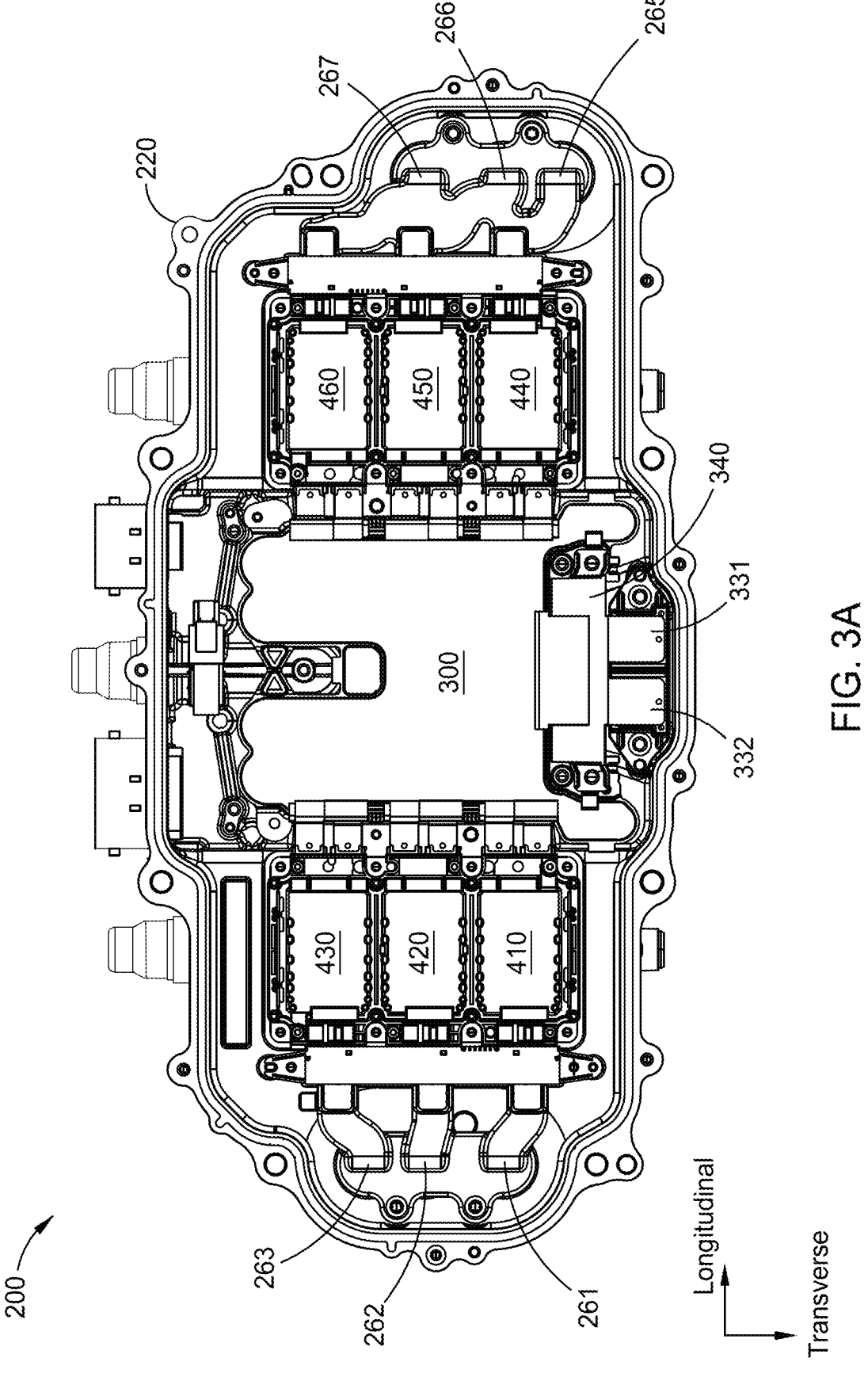
FIGS. 3A, 3B present top sectional views through the traction inverter system, in accordance with embodiments of the present disclosure.
Figure 3B:
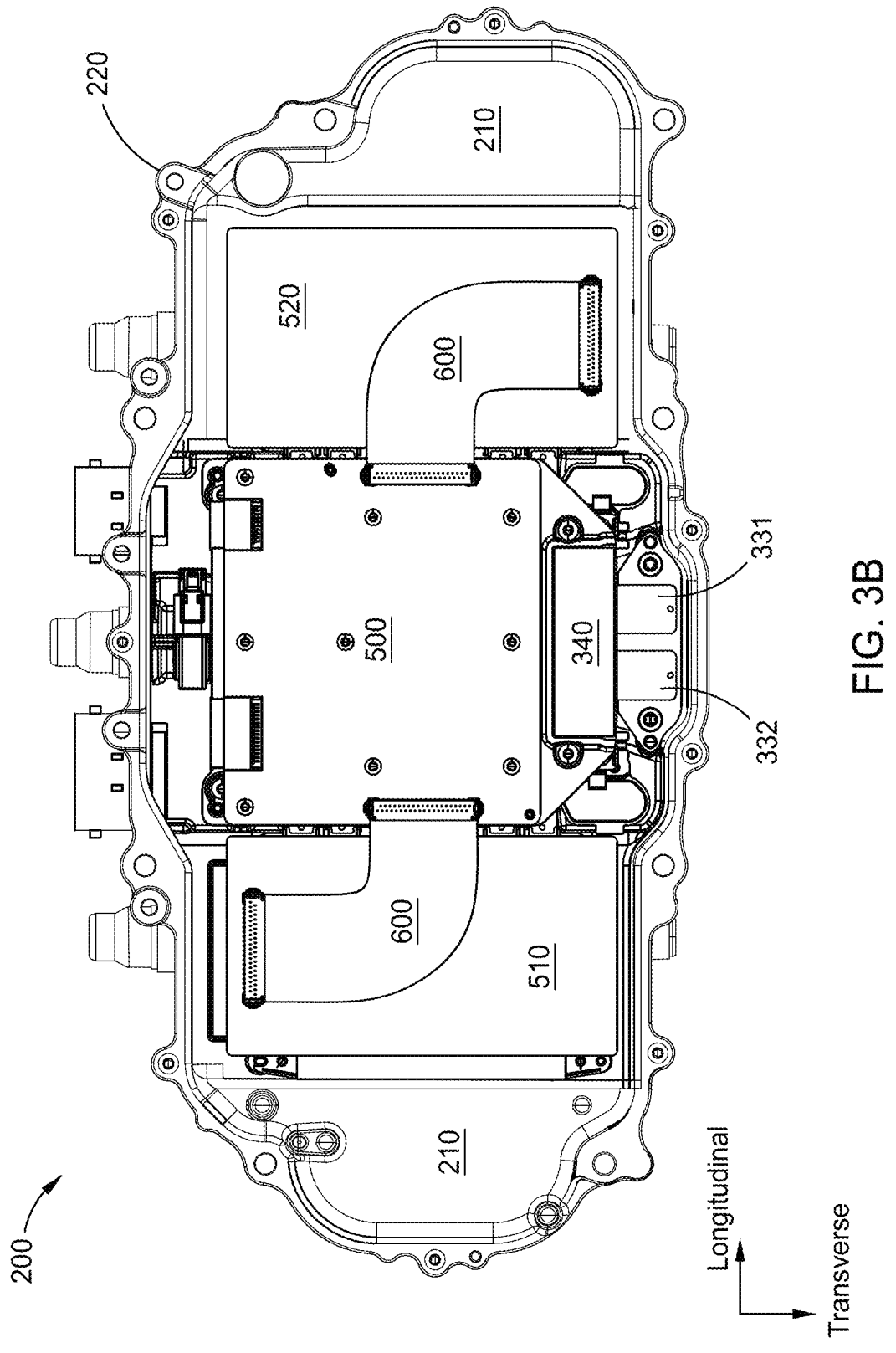

FIGS. 3A, 3B present top sectional views through TIS 200, in accordance with embodiments of the present disclosure. The sectional plane for FIGS. 3A, 3B is defined by the longitudinal and transverse axes. The sectional plane for FIG. 3A passes through the junction between cover 210 and housing 220, while the sectional plane for FIG. 3B passes through cover 210 at a slightly higher vertical elevation than the sectional plane for FIG. 3A.

Figure 3C:
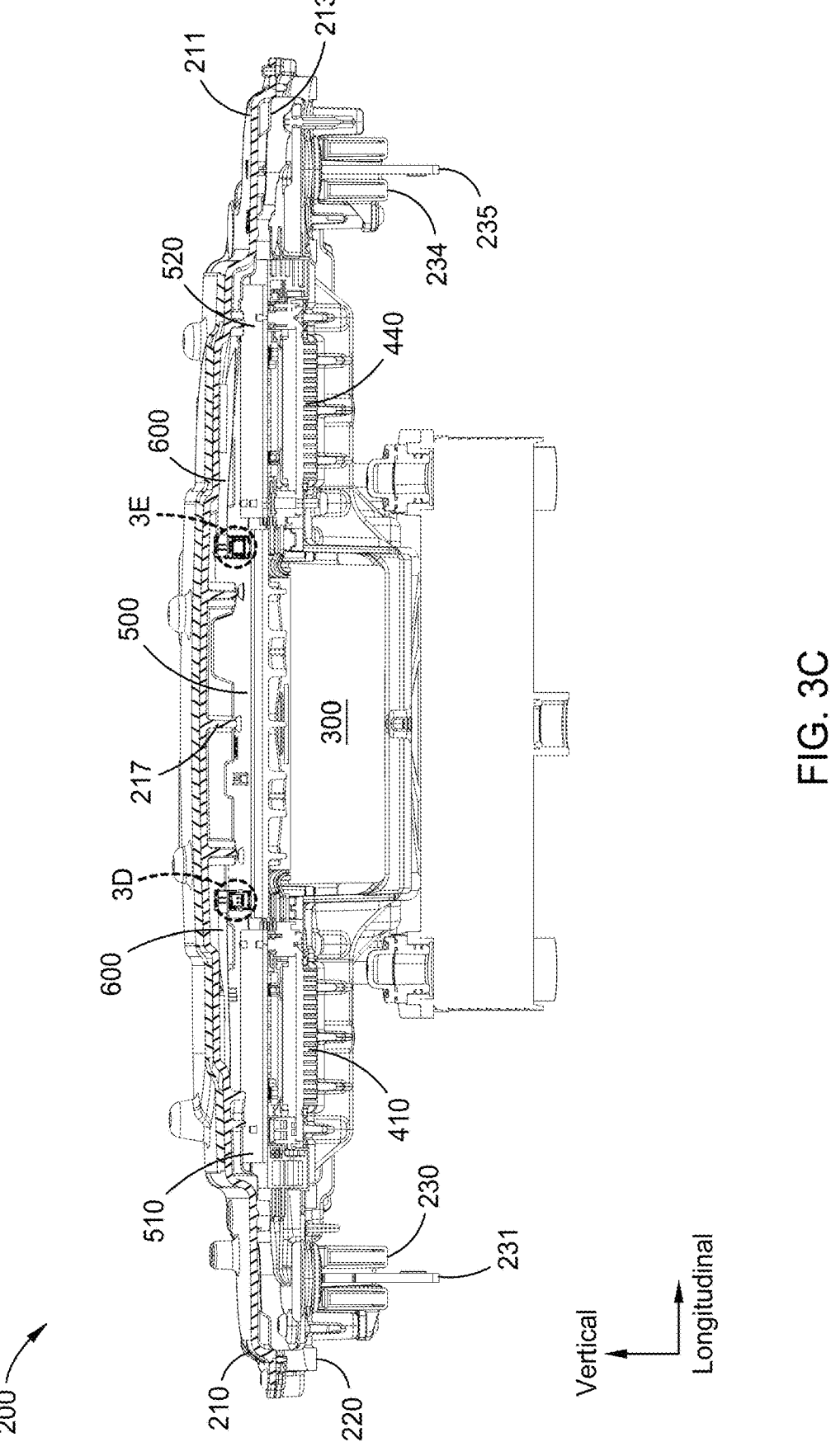
FIG. 3C presents a front sectional view through the traction inverter system, in accordance with embodiments of the present disclosure.

FIG. 3C presents a front sectional view through TIS 200, in accordance with embodiments of the present disclosure. The sectional plane for FIG. 3C is defined by the longitudinal and vertical axes.

Power electronics module 200 includes, inter alia, capacitor module 300, PIMs 410, 420, 430 for motor 1, PIMs 440, 450, 460 for motor 2, main controller board 500, motor controller board 510 for motor 1, and motor controller board 520 for motor 2. Capacitor module 300 is coupled to the input side of PIMs 410, 420, 430 using capacitor busbar contacts that are laser welded to respective PIM busbar contacts. Capacitor module 300 is similarly coupled to the input side of PIMs 440, 450, 460 using capacitor busbar contacts that are laser welded to respective PIM busbar contacts.

PIMs 410, 420, 430, each include an inverter to provide one phase of the 3-phase AC power to AC motor 1. The output side of PIM 410 is coupled to A terminal blade 231 of electric motor 1 busbar assembly 230 via power trace 261. The output side of PIM 420 is coupled to A terminal blade 232 of electric motor 1 busbar assembly 230 via power trace 262. The output side of PIM 430 is coupled to A terminal blade 233 of electric motor 1 busbar assembly 230 via power trace 263.

Similarly, PIMs 440, 450, 460, each include an inverter to provide one phase of the 3-phase AC power to AC motor 2. The output side of PIM 440 is coupled to A terminal blade 235 of electric motor 2 busbar assembly 234 via power trace 265. The output side of PIM 450 is coupled to A terminal blade 236 of electric motor 2 busbar assembly 234 via power trace 266. The output side of PIM 460 is coupled to A terminal blade 237 of electric motor 2 busbar assembly 234 via power trace 267.

The inverters may also function as converters to convert the AC power generated by the AC motor into DC power to recharge the battery during regeneration. Alternatively, PIMs 410, 420, 430, 440, 450, 460 may each include a separate converter for regeneration.

Capacitor module 300 includes a number of capacitors (such as 6, 7, 8, 9, 10, 11, 12, 13, 14, 15, 16, 17, 18, 19, 20, etc.), positive terminal 331, negative terminal 332, and DC common mode choke 340. The positive terminal of each capacitor is connected to a positive capacitor busbar, and the negative terminal of each capacitor is connected to a negative capacitor busbar. The capacitors are coupled in parallel to the battery, and maintain a consistent voltage across the PIM inverters. More particularly, the capacitors stabilize the DC voltage received from the battery to limit fluctuations when the PIM inverters intermittently demand a large (or heavy) DC current. Positive terminal 331 is connected to the positive capacitor busbar and to positive terminal blade 241 of HV battery cable connector 240 (FIGS. 2B, 2C). Negative terminal 332 is connected to the negative capacitor busbar and to negative terminal blade 242 of HV battery cable connector 240 (FIGS. 2B, 2C). DC common mode choke 340 surrounds positive terminal 331 and negative terminal 332, and reduces the transmission of high frequencies to and from capacitor module 300.

Main controller board 500 and motor controller boards 510, 520 each include one or more controllers, processors, supporting components, circuitry, connectors, etc. Main controller board 500 is connected to electrical signal connectors 221, 222. Motor controller board 510 controls the AC power (AC voltage and current) provided to motor 1, while motor controller board 520 controls the AC power (AC voltage and current) provided to motor 2. Main controller board 500 controls the operations of motor controller boards 510, 520 in response to control signals received over the wires coupled to electrical signal connectors 221, 222.

Motor controller board 510 is connected to main controller board 500 via one flexible circuit assembly 600, and motor controller board 520 is connected to main controller board 500 via another flexible circuit assembly 600. In certain embodiments, each flexible circuit assembly 600 has an angled shape (such as a right-angled shape), and may be installed with any relative orientation (such as 180°). Generally, each flexible circuit assembly 600 may have an angled shape or a straight shape.

In certain embodiments, flexible circuit assembly 600 has a flexible printed circuit body with an angled shape (such as a 90° or right-angle, a 45° angle, a 30° angle, etc.), and a connector disposed on each end of the flexible printed circuit body. Main controller board 500 includes two sockets, motor controller board 510 includes one socket, and motor controller board 520 includes one socket. One flexible circuit assembly 600 has one connector that is secured to one socket of main controller board 500, and another connector that is secured to the socket of motor controller board 510. Similarly, the other flexible circuit assembly 600 has one connector that is secured to the other socket of main controller board 500, and another connector that is secured to the socket of motor controller board 520.

Cover 210 has an outer surface 211, an inner surface 213, and ribs 217 for stiffness, strength, etc.

Figures 3D, 3E:
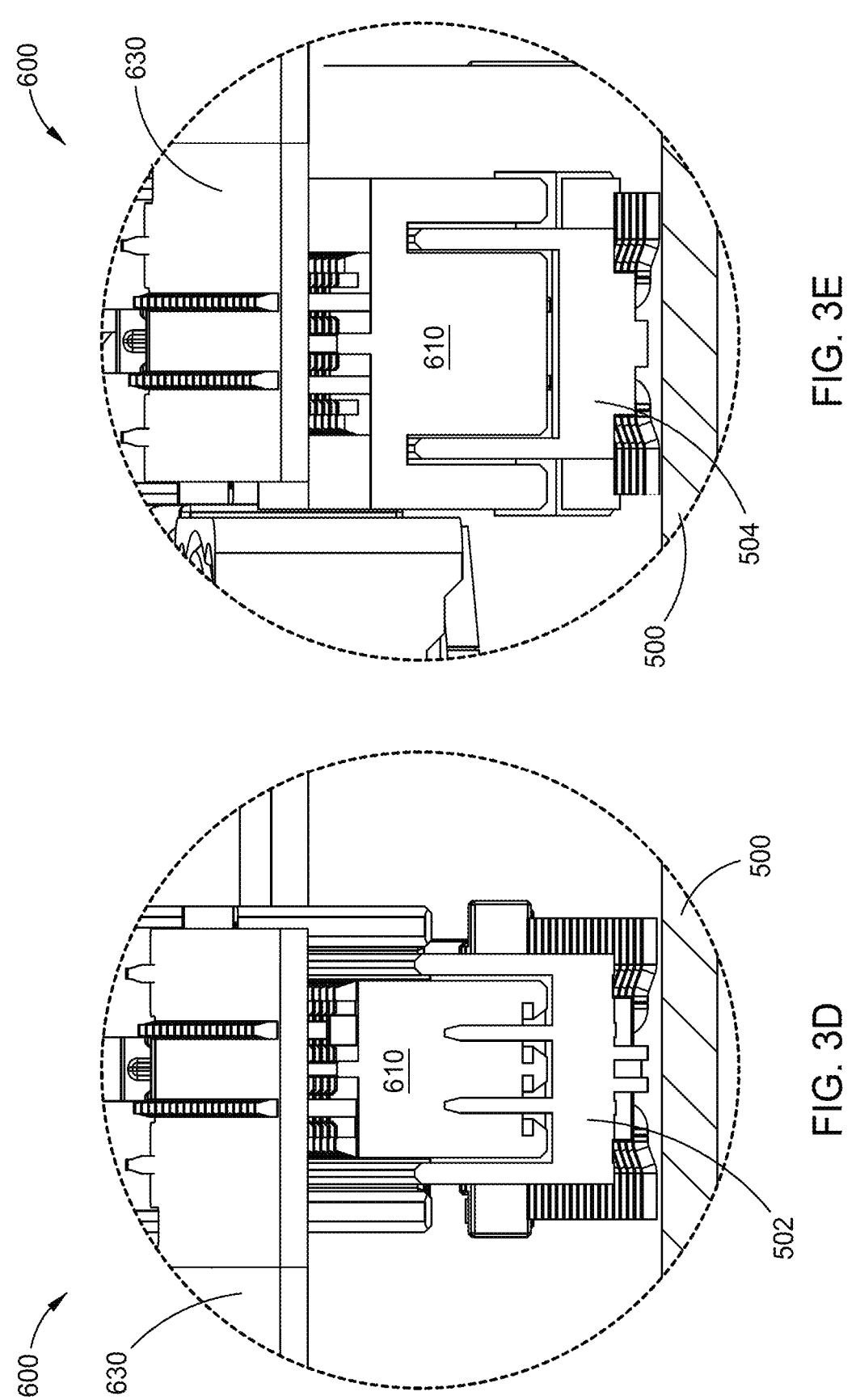
FIGS. 3D, 3E present close up views of portions of FIG. 3C, in accordance with embodiments of the present disclosure.

FIGS. 3D, 3E present close up views of portions of FIG. 3C, in accordance with embodiments of the present disclosure.

FIG. 3D depicts a portion of flexible circuit assembly 600 connected to main controller board 500 and motor controller board 510. Flexible circuit assembly 600 includes connector 610 and flexible printed circuit body 630, a portion of which proximate to connector 610 is depicted. Main controller board 500 includes socket 502 that is configured to receive and secure connector 610 of flexible circuit assembly 600. Socket 502 and connector 610 may include cooperating locking mechanisms, such as bayonet locks, latch locks, lever locks, push-pull locks, crew locks, snap-in locks, etc.

FIG. 3E depicts a portion of flexible circuit assembly 600 connected to main controller board 500 and motor controller board 520. Flexible circuit assembly 600 includes connector 610 and flexible printed circuit body 630, a portion of which that is proximate to connector 610 being depicted. Main controller board 500 includes socket 504 that is configured to receive and secure connector 610 of flexible circuit assembly 600. Socket 504 and connector 610 may include cooperating locking mechanisms, such as bayonet locks, latch locks, lever locks, push-pull locks, crew locks, snap-in locks, etc.

Figure 4A:
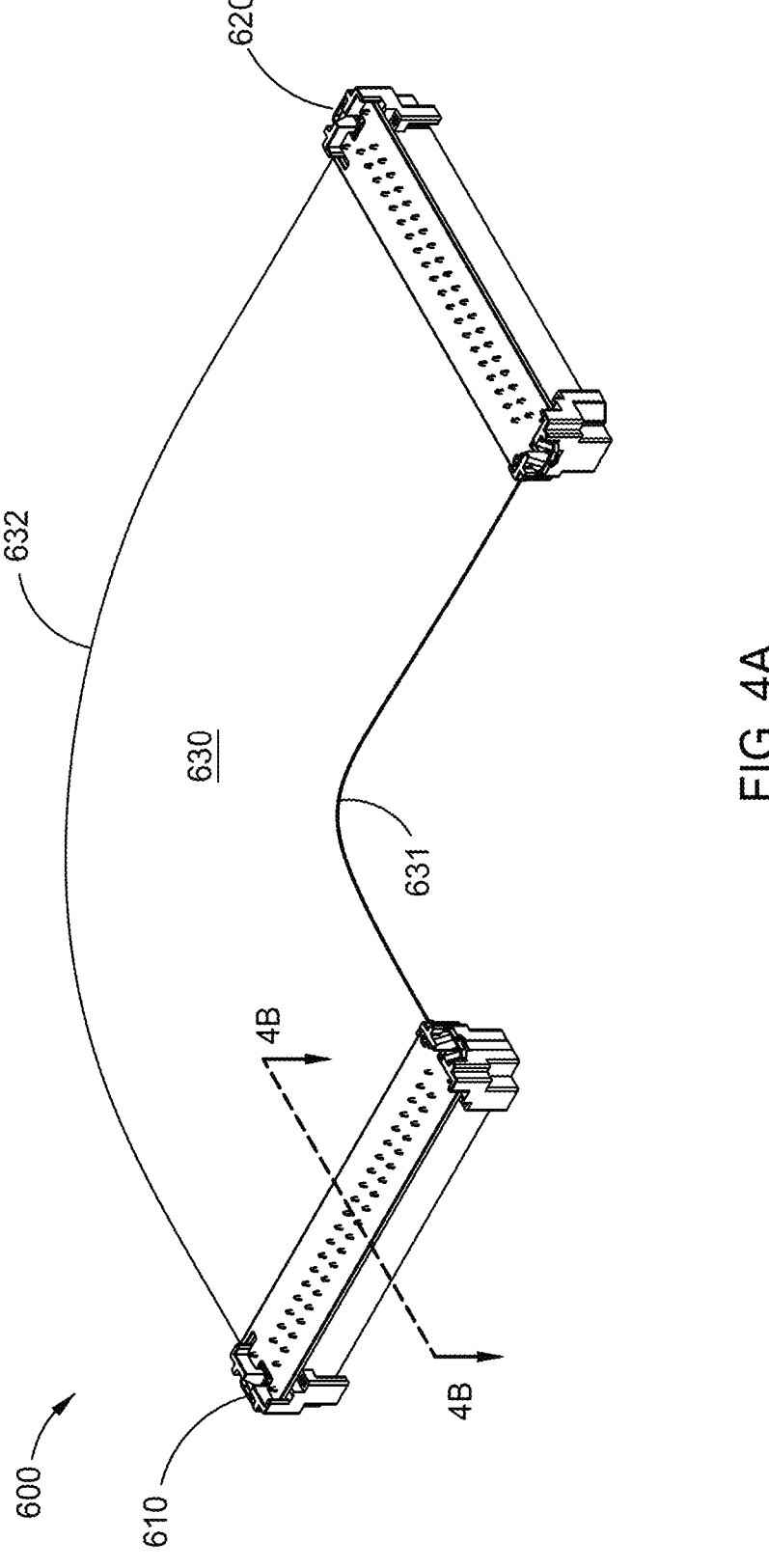
FIG. 4A presents a perspective view of an example flexible circuit assembly, in accordance with embodiments of the present disclosure.

FIG. 4A presents a perspective view of flexible circuit assembly 600, in accordance with embodiments of the present disclosure. Section line 4B is identified.

As noted above, flexible circuit assembly 600 may provide a thinner footprint than an LV wire harness with individual copper wires, which improves the mechanical packaging of the connections between main controller board 500 and motor controller boards 510, 520. Flexible circuit assembly 600 also provides an integrated shielding layer to protect main controller board 500 and motor controller boards 510, 520 from EMI. In various embodiments, each flexible circuit assembly 600 has the same geometry and construction, and may be installed with any relative orientation. For example, each of the flexible circuit assemblies 600 shown in the TIS 200 of FIG. 2B may have the same geometry and construction, but may be installed at an orientation of 180 degrees relative to one another. Using the same components advantageously simplifies parts tracking, simplifies assembly, reduces manufacturing time and cost, etc.

In certain embodiments, flexible circuit assembly 600 includes connector 610, connector 620, and flexible printed circuit body 630 having an angled shape (such as a right-angled shape) with an inner side 631 and an outer side 632. Connector 610 is disposed at one end of flexible printed circuit body 630, while connector 620 is disposed at the other end of flexible printed circuit body 630. Connector 610 and connector 620 may be the same type of connector, such as insulation displacement contact (IDC) or insulation-piercing contact (IPC) connector, DIN 41612 connector, DIL connector, etc. In certain embodiments, the connectors may be 40 position (40P) flexible printed circuit (FPC) connectors. Flexible printed circuit body 630 includes a number of flexible printed circuit layers, as depicted in FIG. 4B.

Figure 4B:
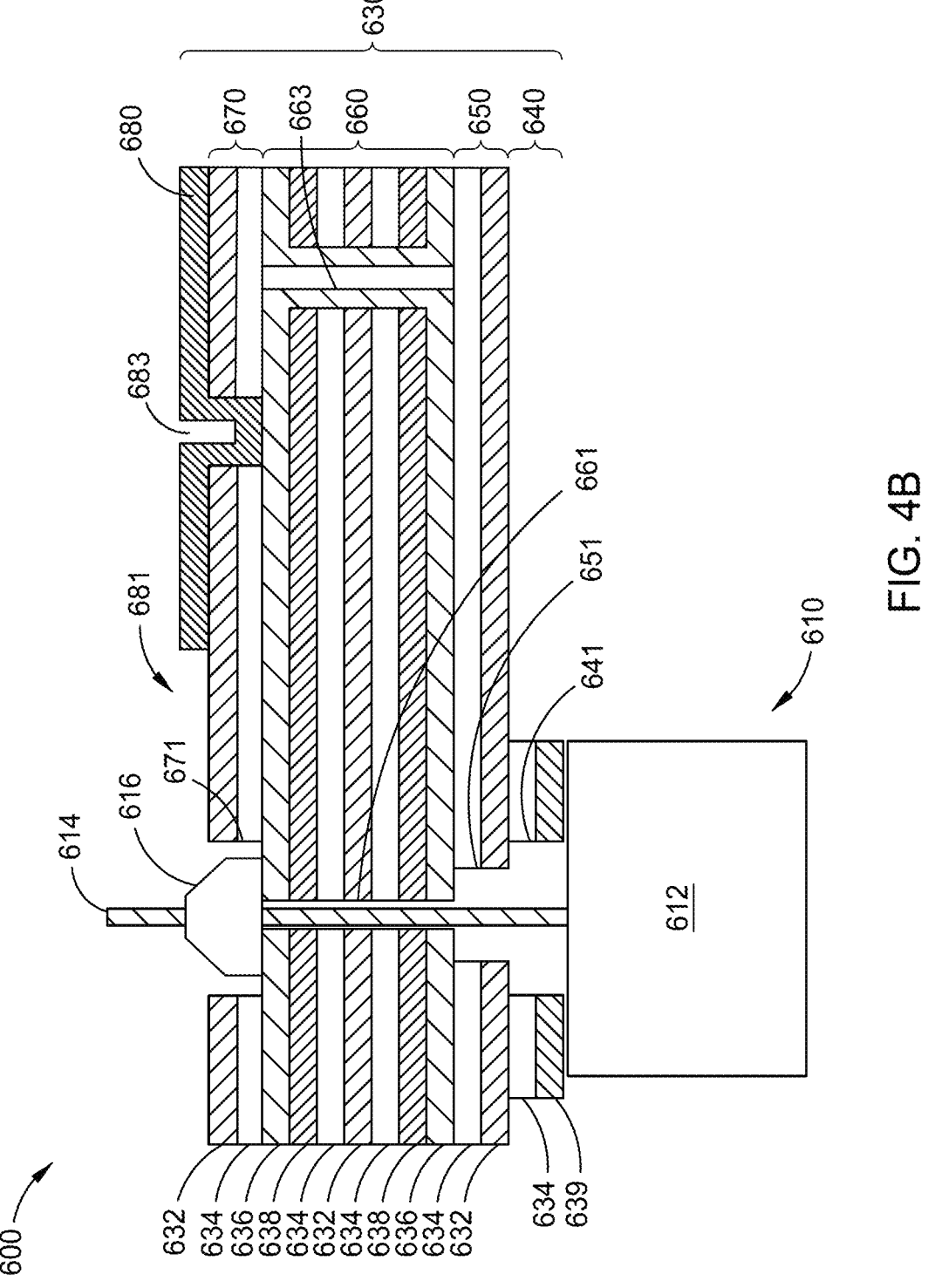
FIG. 4B presents a partial sectional view through the flexible circuit assembly, in accordance with embodiments of the present disclosure.

FIG. 4B presents a partial sectional view through flexible circuit assembly 600, in accordance with embodiments of the present disclosure.

Connector 610 includes connector housing 612 that secures a number of electrical contacts (pins, terminals, etc.) in a predetermined pattern, such as two offset rows. Each electrical contact mates with a respective electrical contact in a socket on main controller board 500, motor controller board 510, or motor controller board 520 to form an electrical connection. A pin extends from each electrical contact into flexible printed circuit body 630 to contact a different signal, power, or ground trace within flexible printed circuit body 630. For example, pin 614 extends from connector housing 612 into (and through) flexible printed circuit body 630, contacts one of the traces, and is secured to flexible printed circuit body 630 using solder joint 616.

Generally, flexible printed circuit body 630 includes a number of laminated layers, such as one or more polyimide (or polyester) layers 632, adhesive layers 634, plating layers 636, copper layers 638, FR4 (or other composite) layer 639, etc. Flexible printed circuit body 630 may be arranged into a number of regions, and each region may include one or more layers.

In certain embodiments, flexible printed circuit body 630 includes stiffener region 640, cover region 650, copper clad laminate (CCL) region 660, cover region 670, and EMI shield region 680. Cover region 650 forms a first side of flexible printed circuit body 630, while cover region 650 forms a second side of flexible printed circuit body 630. Cover region 650 and cover region 670 surround and protect CCL region 660, which includes signal, power, and ground traces. Generally, CCL region 660 may also be known as a trace layer region.

Stiffener region 640 is a very short region that is disposed between connector housing 612 and the end of cover region 650 to stiffen the mechanical connection between flexible printed circuit body 630 and connector housing 612. Stiffener region 640 may include an FR4 layer 639 and an adhesive layer 634. FR4 may be formed from epoxy resin, and one or more layers of woven fiberglass mat. Stiffener region 640 defines through hole TH 641 through which pin 614 passes. In certain embodiments, surface mount technology (SMT) may be used, which may obviate the need for through holes.

Cover region 650 may include a polyimide layer 632 and an adhesive layer 634. The polyimide layer 632 at the end of cover region 650 contacts the adhesive layer 634 of stiffener region 640. Cover region 650 defines through hole 651 through which pin 614 passes.

CCL region 660 may include a first plating layer 636, a first copper layer 638, a first adhesive layer 634, a polyimide layer 632, a second adhesive layer 634, a second copper layer 638, and a second plating layer 636. The first copper layer 638 forms a ground and EMI shield layer, while the second copper layer 638 contains the signal, power and ground traces. Plated through hole (PTH) 663 connects the ground traces within the second copper layer 638 to the ground layer within the first copper layer 638. The ground current is drained from flexible printed circuit body 630 through the pins connecting the ground planes to the electrical connectors in connector housing 612 of connector 620, and then through the electrical connectors in the socket on motor controller board 510 or motor controller board 520. CCL layer 660 defines through hole 661 through which pin 614 passes.

Cover region 670 may include a polyimide layer 632 and an adhesive layer 634. Cover region 650 defines through hole 671 through which pin 614 passes and in which solder joint 616 is formed. Solder joint 616 forms a mechanical connection between pin 614 and the second plating layer 636 of CCL layer 660.

EMI shield region 680 extends along cover region 670 between connector 610 and connector 620. EMI shield region 680 may be formed from a silver sheet, silver ink, copper layer(s), shielding film, etc. Contact portion 683 connects EMI shield region 680 to the ground traces within the second copper layer 638 of CCL layer 660. EMI shield region 680 exposes end 681 of cover region 670.

Generally, each layer in each region may have a thicknesses that lies within a range of thicknesses.

For stiffener region 640, the FR4 layer 639 may have a thickness between 400 μm and 600 μm (such as 500 μm), and the adhesive layer 634 may have a thickness between 40 μm and 60 μm (such as 50 μm).

For cover region 650, the polyimide layer 632 may have a thickness between 20 μm and 30 μm (such as 25 μm), and the adhesive layer 634 may have a thickness between 20 μm and 35 μm (such as 28 μm).

For CCL region 660, the first plating layer 636 may have a thickness between 10 μm and 20 μm (such as 15 μm), the first copper layer 638 may have a thickness between 15 μm and 20 μm (such as 17.5 μm), the first adhesive layer 634 may have a thickness between 5 μm and 15 μm (such as 10 μm), the polyimide layer 632 may have a thickness between 20 μm and 30 μm (such as 25 μm), the second adhesive layer 634 may have a thickness between 5 μm and 15 μm (such as 10 μm), the second copper layer 638 may have a thickness between 15 μm and 20 μm (such as 17.5 μm), and the second plating layer 636 may have a thickness between 10 μm and 20 μm (such as 15 μm).

For cover region 670, the polyimide layer 632 may have a thickness between 20 μm and 30 μm (such as 25 μm), and the adhesive layer 634 may have a thickness between 20 μm and 35 μm (such as 28 μm).

EMI shield region 680 may have a thickness between 10 μm and 20 μm (such as 16 μm).

Figure 5:
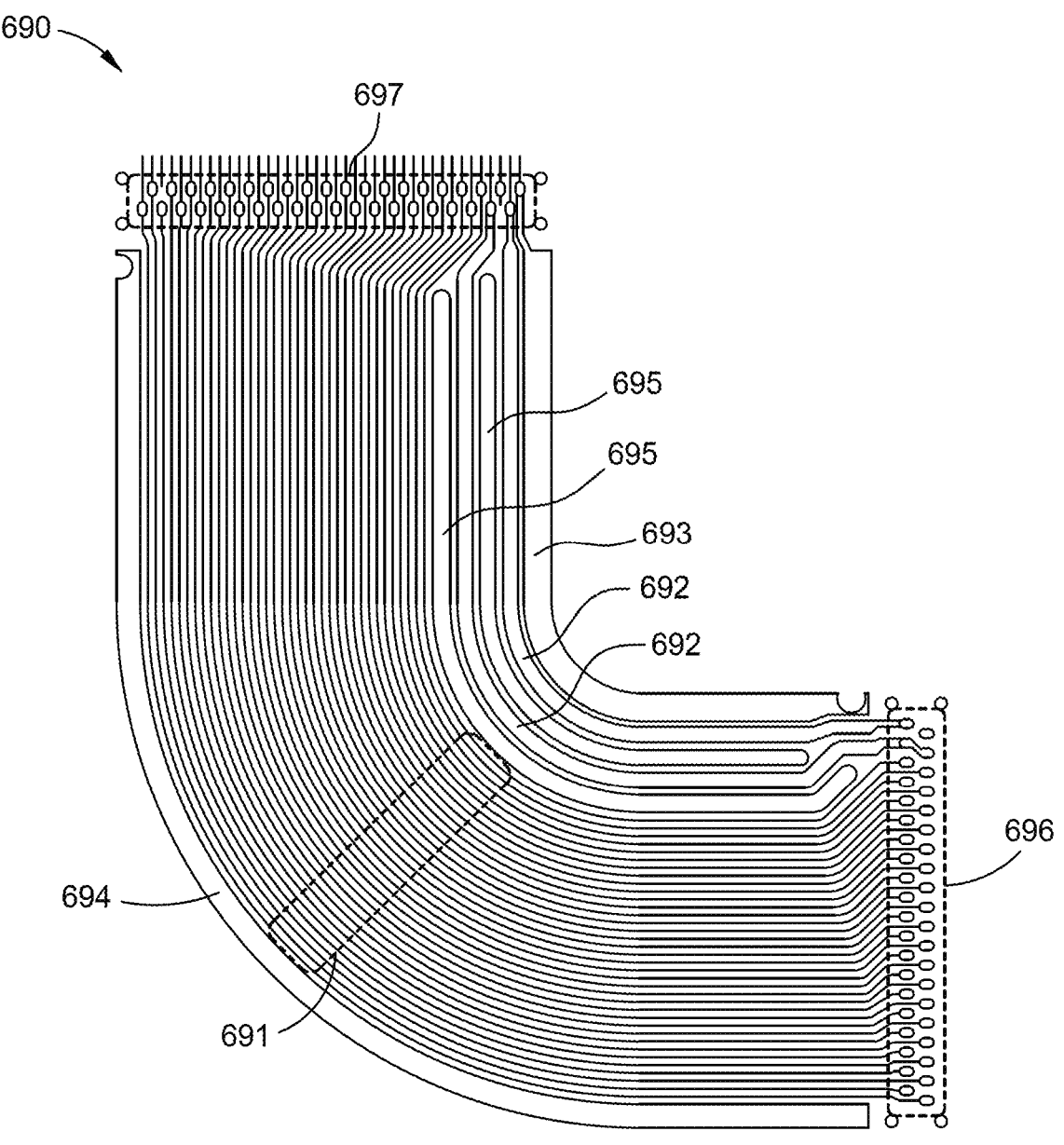
FIG. 5 presents a plan view of the traces of the flexible circuit assembly, in accordance with embodiments of the present disclosure.

FIG. 5 presents a plan view of traces 690 of flexible circuit assembly 600, in accordance with embodiments of the present disclosure.

Traces 690 are formed within second copper layer 638 of CCL region 660, and include signal traces 691, power traces 692, inner ground trace 693, outer ground trace 694, and additional ground traces 695. Generally, signal traces 691 are narrower in width than power traces 692, and power traces 692 are narrower in width than inner ground trace 693 and outer ground trace 694. In one example, signal traces 691 are about five times narrower in width than power traces 692, and power traces 692 are about two times narrower in width than inner ground trace 693 and outer ground trace 694. Additional ground traces 695 may be the same or somewhat narrower in width than inner ground trace 693 and outer ground trace 694, and somewhat wider than power traces 692.

Traces 690 also include connector pin pads 696 for connector 610, and connector pin pads 697 for connector 620. Each signal trace 691, power trace 692, and ground trace 693 are each connected to one of the connector pin pads 696 and one of the connector pin pads 697. Additional ground traces 694 and outer ground trace 695 are not connected to any pin pads.

In the example depicted in FIG. 5, signal traces 691 include 36 signal traces two power traces 692. Other numbers and distributions of signal traces 691 and power traces 692 are also supported (such as one power trace 692, three power traces 692, etc.). Power traces 692 are advantageously routed along inner side 631 of flexible printed circuit body 630 to reduce voltage drop and copper usage by each power trace 692.

Generally, first and second copper layers 638 of CCL region 660 may also be known as trace layers.

Figure 6A:
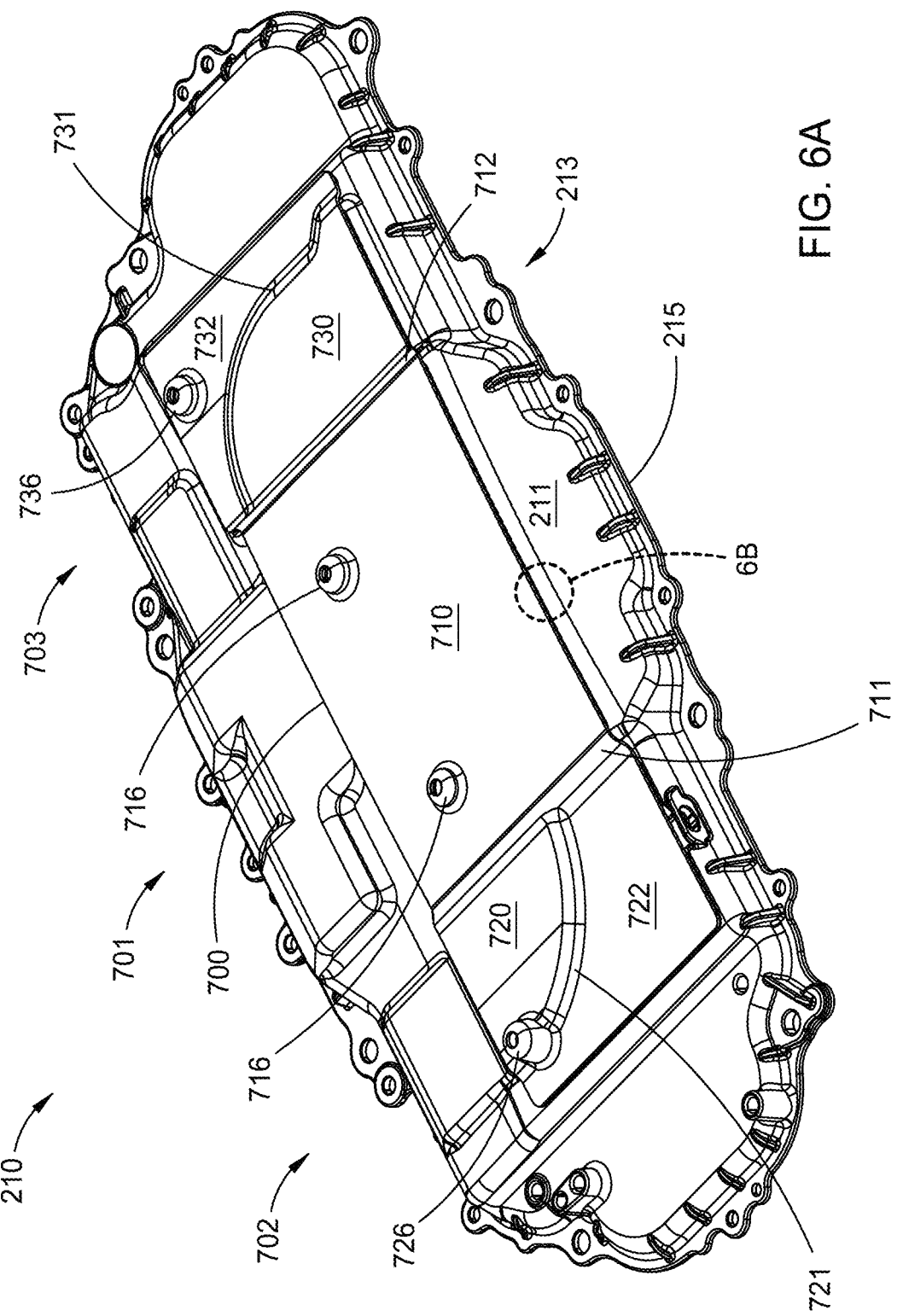
FIG. 6A presents a perspective view of an example cover of the traction inverter system, in accordance with embodiments of the present disclosure.
Figure 6B:
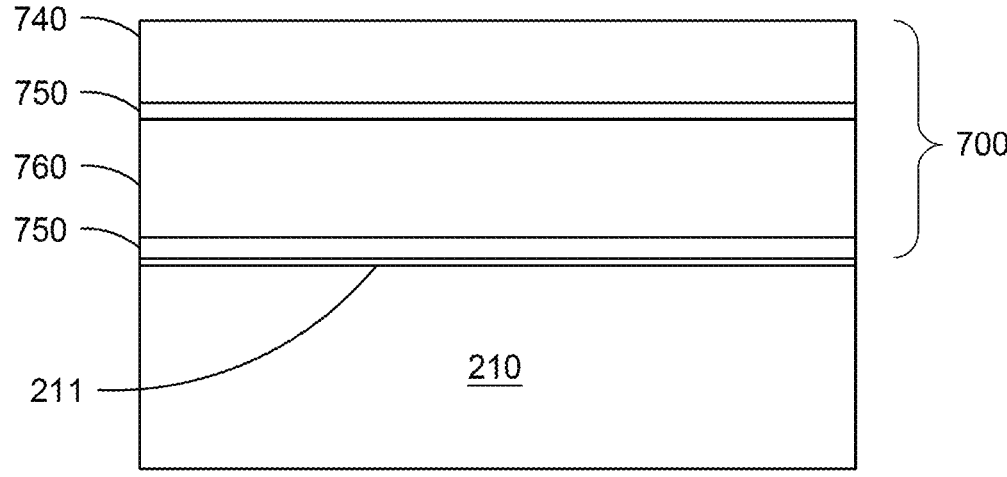
FIG. 6B presents a sectional view through the cover of the traction inverter system depicted in FIG. 6A, in accordance with embodiments of the present disclosure.

FIG. 6A presents a perspective view of cover 210 of TIS 200, in accordance with embodiments of the present disclosure. The area of the sectional view of FIG. 6B is indicated.

As discussed above, cover 210 may be a metal casting, stamping, etc., that is formed as a single component to closely conform to the locations of the power electronic components contained within housing 220, which may also minimize the volume within TIS 200. Advantageously, cover 210 includes CLD material 700 that reduces the airborne and structureborne noise radiated by cover 210 and propagated to cabin 140 (for example, by a factor of 5, 10, etc.).

In certain embodiments, cover 210 includes, inter alia, outer surface 211, inner surface 213 (not visible), perimeter 215, and bosses 216. Outer surface 211 includes central region 701, lateral region 702, and lateral region 703. Inner surface 213 may include ribs for stiffness, strength, etc. Perimeter 215 is configured to be attached to housing 220 of TIS 200.

Central region 701, lateral region 702, and lateral region 703 each include, inter alia, one or more flat portions that are located above certain spaces formed between inner surface 213 of cover 210 and the components housed within TIS 200, such as main controller board 500, motor controller board 510, motor controller board 520, flexible circuit assemblies 600, etc. Transition regions may couple adjacent flat portions that are located at different relative elevations such that central region 701, lateral region 702, and lateral region 703 form contours that conform to locations of components within housing 220. Advantageously, CLD material 700 may conform to the contours formed by central region 701, lateral region 702, and lateral region 703.

The flat portions of cover 210 that are located above these spaces may radiate noise more effectively than other regions of cover 210 that include more complex structural features. Accordingly, in certain embodiments, CLD material 700 may be attached to less than 100% of cover 210, such as about 30% to about 70%. For example, CLD material 700 may be attached to about 40% of cover 210.

In certain embodiments, CLD material 700 may include central region 710, lateral regions 720, 722, and lateral regions 730, 732. Central region 710 may be attached to a flat portion of central region 701, which is disposed above main controller board 500. Lateral region 720 may be attached to a flat portion of lateral region 702 which is disposed above flexible circuit assembly 600, and lateral region 722 may be attached to a flat portion of lateral region 702 which is disposed above a portion of motor controller board 510. Similarly, lateral region 730 may be attached to a flat portion of lateral region 703 which is disposed above flexible circuit assembly 600, and lateral region 732 may be attached to a flat portion of lateral region 703 which is disposed above a portion of motor controller board 520.

CLD material 700 advantageously includes transition regions that allow CLD material 700 to conform to (or follow) the contours of outer surface 211 from central region 710 to lateral regions 720, 730, as well as the contours of outer surface 211 within lateral regions 720, 730. In other words, CLD material 700 may be formed as a single, contiguous member to avoid discontinuities that may impair noise reduction effectiveness.

Accordingly, CLD material 700 may also include transition regions 711, 712, 721, and 731. Transition region 711 joins central region 710 and lateral regions 720, 722, while transition region 712 joins lateral regions 730, 732. Similarly, transition region 721 joins lateral region 720 and lateral region 722, while transition region 731 joins lateral region 730 and lateral region 732.

Additionally, CLD material 700 may include several raised portions or towers, and each tower is aligned above a respective boss 216 to attach certain components to cover 210, such as a mount for a wiring harness, etc. Each tower may define an opening that is configured to receive a mount fastener, such as a snap fit connector, etc., which attaches the mount to the tower and/or to boss 216. In this manner, each pair of towers and bosses 216 cooperate to secure the component to cover 210. In the example depicted in FIG. 6A, central region 710 includes two towers 716 that are aligned with bosses 216 formed in central region 701, lateral region 720 includes tower 726 that is aligned with boss 216 formed in lateral region 702, and lateral region 730 includes tower 736 that is aligned with boss 216 formed in lateral region 703.

FIG. 6B presents a sectional view through cover 210 of FIG. 6A, in accordance with embodiments of the present disclosure.

CLD material 700 includes metal constraining layer 740 and polymer layer 760 attached together by a first adhesive layer 750. A second adhesive layer 750 attaches polymer layer 760 to outer surface 211 of cover 210. In some embodiments, CLD material 700 may include one or more portions in which either metal constraining layer 740 or polymer layer 760 is absent.

In certain embodiments, metal constraining layer 740 may be formed from thin corrosion-resistant steel sheet metal plate, and may have a thickness that lies within a range of thicknesses between 1 mm and 2 mm, such as 1.5 mm. In other embodiments, metal constraining layer 740 may be formed from aluminum sheet metal plate, and may have a thickness that lies within a range of thicknesses between 3 mm and 6 mm, such as 4.5 mm. Other types of metal (or sufficiently dense material) may also be used.

In certain embodiments, polymer layer 760 may be formed from a closed cell polymer foam, and may have a thickness that lies within a range of thicknesses between 1 mm to 3 mm, such as 2 mm.

In certain embodiments, CLD material 700 may have a thickness that lies within a range of thicknesses between 2 mm to 5 mm, such as 3.5 mm.

The many features and advantages of the disclosure are apparent from the detailed specification, and, thus, it is intended by the appended claims to cover all such features and advantages of the disclosure which fall within the scope of the disclosure. Further, since numerous modifications and variations will readily occur to those skilled in the art, it is not desired to limit the disclosure to the exact construction and operation illustrated and described, and, accordingly, all suitable modifications and equivalents may be resorted to that fall within the scope of the disclosure.

What is claimed is:

1. A flexible circuit assembly for a traction inverter system, comprising: a flexible printed circuit body forming an angled shape having an inner side and an outer side, the flexible printed circuit body including: a stiffener region, a trace layer region disposed between a first cover region and a second cover region, the trace layer region including one or more trace layers, and a shield region including a shield layer; a first connector attached to the stiffener region of a first end of the flexible printed circuit body; and a second connector attached to the stiffener region of a second end of the flexible printed circuit body, wherein the trace layer region includes a first trace layer and a second trace layer, and wherein the first trace layer includes a first ground trace routed along the inner side, and a second ground trace routed along the outer side, wherein the first trace layer includes at least one power trace routed proximate to the first ground trace, and signal traces routed between the at least one power trace and the second ground trace.

2. The flexible circuit assembly of claim 1, wherein the second connector is oriented substantially perpendicular to the first connector.

3. The flexible circuit assembly of claim 1, wherein the first ground trace and the second ground trace have a first width, the power trace has a second width that is less than the first width, and each signal trace has a third width that is less than the second width.

4. The flexible circuit assembly of claim 3, wherein the first width is at least two times greater than the second width, and the second width is at least five times greater than the third width.

5. The flexible circuit assembly of claim 1, wherein the first trace layer includes at least one additional ground trace layer disposed adjacent to the power trace.

6. The flexible circuit assembly of claim 1, wherein the second trace layer is an additional shield layer.

7. A traction inverter system including a first flexible circuit assembly according to claim 1, wherein:
the first connector of the first flexible circuit assembly is coupled to a main controller board of the traction inverter system; and
the second connector of the first flexible circuit assembly is coupled to a first motor controller board of the traction inverter system.

8. The traction inverter system of claim 7, further including a second flexible circuit assembly according to claim 1, wherein:
the first connector of the second flexible circuit assembly is coupled to the main controller board of the traction inverter system;

the second connector of the second flexible circuit assembly is coupled to a second motor controller board of the traction inverter system; and
the angled shape of the first flexible circuit assembly has an opposite orientation to the angled shape of the second flexible circuit assembly.

9. A cover for a traction inverter system, comprising:
an outer surface including:
a central region, a first lateral region, and a second lateral region, and
a constrained layer damping material attached to at least a portion of the central region, at least a portion of the first lateral region, and at least a portion of the second lateral region;
an inner surface including ribs; and
a perimeter configured to be attached to a housing,
wherein the central region, the first lateral region, and the second lateral region form contours that conform to locations of components within the housing, and the constrained layer damping material conforms to the contours.

10. The cover according to claim 9, further comprising:
one or more bosses extending from at least one of the central region, the first lateral region, and the second lateral region, each boss defining an opening that is configured to receive a respective fastener; and
one or more towers extending from the constrained layer damping material, each tower aligned above one of the bosses, each tower defining an opening that is configured to receive the respective fastener.

11. The cover according to claim 9, wherein the constrained layer damping material includes:
a central region, a first lateral region, and a second lateral region;
a first transition region joining the central region to the first lateral region; and
a second transition region joining the central region to the second lateral region.

12. The cover according to claim 11, wherein the first lateral region of the constrained layer damping material includes a third transition region, and the second lateral region of the constrained layer damping material includes a fourth transition region.

13. The cover according to claim 11, wherein the constrained layer damping material includes a metal constraining layer, a polymer layer, and at least one adhesive layer to secure the metal constraining layer to the polymer layer.

14. The cover according to claim 13, wherein:
the metal constraining layer is sheet steel and has a thickness between 1 mm and 2 mm;
the polymer layer is high-temperature polymer and has a thickness between 1 mm and 3 mm.

15. The cover according to claim 11, wherein transition regions conform to the contour between the central region and the first lateral region, and the contour between the central region and the second lateral region.

16. A traction inverter system, comprising:
a first flexible circuit assembly attached to a main controller board and a first motor controller board;
a second flexible circuit assembly attached to the main controller board and a second motor controller board, wherein each flexible circuit assembly includes:
a flexible printed circuit body forming an angled shape having an inner side and an outer side,
a first connector attached to a first end of the flexible printed circuit body, and a second connector attached to a second end of the flexible printed circuit body; and a cover, including:

an outer surface including:

a central region, a first lateral region, and a second lateral region, and a constrained layer damping material attached to at least a portion of the central region, at least a portion of the first lateral region, and at least a portion of the second lateral region, an inner surface including ribs, and a perimeter attached to a housing, wherein the central region, the first lateral region, and the second lateral region form contours that conform to locations of the first and second flexible circuit assemblies, the main controller board, and the first and second motor controller boards within the housing, and the constrained layer damping material conforms to the contours.

17. The traction inverter system of claim 16, wherein the flexible printed circuit body includes:

a stiffener region;

a copper clad laminate (CCL) region disposed between a first cover region and a second cover region, the CCL region including a trace layer that includes a first ground trace routed along the inner side, and a second ground trace routed along the outer side; and a shield region including a shield layer.

18. The traction inverter system of claim 16, wherein:

one or more bosses extend from at least one of the central region, the first lateral region, and the second lateral region, and each boss defines an opening that is configured to receive a respective fastener; and one or more towers extend from the constrained layer damping material, each tower is aligned above one of the bosses, and each tower defines an opening that is configured to receive the respective fastener.

* * * * *